United States Patent [19]

Ueda et al.

[11] Patent Number: 5,243,577
[45] Date of Patent: Sep. 7, 1993

[54] ELECTRONIC APPARATUS

[75] Inventors: Toshiyuki Ueda, Ikoma; Masato Hiramoto, Souraku; Kazumasa Kimura, Yamatokoriyama, all of Japan

[73] Assignee: Sharp Kabushiki Kaisha, Osaka, Japan

[21] Appl. No.: 624,232

[22] Filed: Dec. 7, 1990

[30] Foreign Application Priority Data

Dec. 11, 1989 [JP] Japan .................. 1-321642
Dec. 11, 1989 [JP] Japan .................. 1-321643

[51] Int. Cl.$^5$ .................. G11C 5/14; H03K 17/24
[52] U.S. Cl. .................. 365/229; 365/228; 307/64
[58] Field of Search .......... 365/226, 228, 229; 307/64; 371/66; 361/92

[56] References Cited

U.S. PATENT DOCUMENTS 4,451,742 5/1984 Aswell .................. 365/229 X
4,777,626 10/1988 Matsushita et al. ....... 365/229 X

FOREIGN PATENT DOCUMENTS 55-71000 5/1980 Japan .
59-186192 10/1984 Japan .
60-72012 4/1985 Japan .................. 365/229
61-29485 2/1986 Japan .
63-64693 3/1988 Japan .................. 365/229
63-187315 9/1988 Japan .
63-239578 10/1988 Japan .
1-244560 9/1989 Japan .

*Primary Examiner*—Joseph A. Popek
*Attorney, Agent, or Firm*—Nixon & Vanderhye

[57] ABSTRACT

An electronic apparatus is provided with a main battery, semiconductor memories having a chip select input (active low), a backup battery, a pull-up resistor, a control unit for selecting one of the semiconductor memories, and a selection control line connected between the control unit and the chip select input. The selection control line is connected to the backup battery through the pull-up resistor. A switch for closing or opening the selection control line is connected between the selection control unit and the junction point of the control line and the pull-up resistor. A switch control unit is provided which controls the switch to open the control line when the semiconductor memory is powered by the backup battery. In another electronic apparatus having a detection circuit for detecting the voltage of the backup battery, the switch is closed only when the voltage is to be monitored.

7 Claims, 4 Drawing Sheets

ELECTRONIC APPARATUS

BACKGROUND OF THE INVENTION

1. Field of the Invention

This invention relates to an electronic apparatus comprising a semiconductor memory unit, and more particularly to an electronic apparatus in which contents of a semiconductor memory unit can be retained by supplying power from a backup power source even when the main power is lost.

2. Description of the Prior Art

In recent years, various types of portable electronic apparatus having a battery-driven microcomputer system which is miniaturized by advancements in LSI technology have found practical application. Furthermore, many of these electronic apparatus have a built-in battery for use as a battery backup to retain the stored contents of a semiconductor memory unit while the main power source battery is being replaced or when it has become worn out.

As a typical example of such an apparatus having a backup battery, a portable terminal apparatus which can be connected to a mainframe computer through a communication system is illustrated in FIG. 3. This apparatus comprises an LSI 1 in which a CPU and I/O interface unit are incorporated, a ROM 2, a RAM 3, a liquid crystal display unit 4, and a keyboard 5. The LSI 1, ROM 2, RAM 3 and liquid crystal display unit 4 are powered by a main battery 6. The RAM 3 is connected to the main battery 6 through a diode $D_1$, and powered also by a backup battery 7 through a diode $D_2$.

The chip select terminal CS (active low) of the RAM 3 is connected to the output port OUT of the LSI 1 via the selection control line 8. When the RAM 3 is to be accessed, a low level active signal is output from the output port OUT.

The selection control line 8 is raised to the level of the power source voltage $V_{CC}$ by a pull-up resistor R in order to prevent misoperation in the chip selection.

In the prior art apparatus, while the main battery 6 is being replaced or when it becomes worn out, the contents of the RAM 3 can be retained by the power supplied from the backup battery 7. In such a case, however, a bypass current flows to the output port OUT of the LSI 1 via the pull-up resistor R and the selection control line 8.

Therefore, in such an electronic apparatus of the prior art, unnecessary power is consumed by a sneak current flowing through the pull-up resistor R during the time the RAM 3 is powered by the backup battery 7. This causes the life of the backup battery 7 to be shortened, and thus the backup time by the battery 7 is considerably reduced.

FIG. 4 illustrates another portable terminal of the prior art. In the apparatus of FIG. 4, a backup battery 7 is connected to a voltage detection circuit 10 which comprises a detection IC 10A and a pull-down resistor 11. The voltage detection circuit 10 detects the output voltage of the backup battery 7, and its output level is inverted when the output voltage of the backup battery 7 falls below a predetermined threshold level. The output of the voltage detection circuit 10 is coupled to an input port IN of an LSI 1 through a level shift circuit 12 which shifts the output of the voltage detection circuit 10 to a level suitable for the input port IN.

A CPU in the LSI 1 periodically or intermittently monitors the output of level shift circuit 12 (i.e., the output of the detection circuit 10), using an interruption program or the like. When the CPU in the LSI 1 judges that the output voltage of the backup battery 7 has dropped below a fixed level, an alarm message is displayed on a display device (not shown in FIG. 4) to warn the user to replace the backup battery 7 with a new one. By this means, undesirable loss of data due to the lack of backup can be prevented from occurring.

In order for the detection circuit 10 to detect the voltage of the backup battery 7, however, current must pass the pull-down resistor 11. Therefore, the pull-down resistor 11 continuously consumes power. This causes the life of the backup battery 7 to be shortened, and thus the backup time by the battery 7 is considerably reduced.

As mentioned above, the voltage detected by the detection circuit 10 is not always monitored by the CPU in the LSI 1. Therefore, in such a prior art apparatus, the detection circuit 10 unnecessarily consumes power in periods of time other than when the voltage monitor operation is performed by the CPU in the LSI 1.

SUMMARY OF THE INVENTION

The electronic apparatus of this invention, which overcomes the above-discussed and numerous other disadvantages and deficiencies of the prior art, comprises: a main power source; at least one semiconductor memory unit having a chip select input; a backup power source for supplying power for retaining contents of said semiconductor memory unit; selection control means; voltage-pulling means; and a selection control line connected between said selection control means and said chip select input, said selection control line being connected to said backup power source through said voltage-pulling means, and further comprises: switch means for closing or opening said selection control line, said switch means being connected between said selection control means and the junction point of said control line and said voltage-pulling means; and switch control means for controlling said switch means to open said control line when said semiconductor memory unit is powered by said backup power source.

In the above configuration, said voltage-pulling means may be a pull-up resistor.

The chip select input may be active low.

The switch means may be an analog switch.

In an electronic apparatus having above-mentioned configuration, the further control means controls the switch means to cut off the selection control line during backup of the semiconductor memory unit by the backup power source. Since this cut off is done at a position which is closer to the further control means that the connection point with the voltage pulling means in the selection control line, a sneaking current from the backup power source is prevented from flowing to the further control means via the voltage pulling means.

In an embodiment in which the voltage pulling means is a pull-up resistor and the chip select input is active low, the chip select input is fixed at High by the pull-up resistor when the selection control line is opened. At this case, therefore, the semiconductor memory unit is not accessible.

If the further control means is designed so as to open the switch means during periods when the semiconductor memory unit is not accessed in addition to the period of backup, the life of the main power source, as well as the backup power source, can be prolonged.

In another aspect of the invention, an electronic apparatus comprises: a main power source; at least one semiconductor memory unit; a backup power source for supplying power for retaining the contents of said semiconductor memory unit; and voltage detection means for detecting the voltage output from said backup power source, said voltage detection means being connected to said backup power source via a line, and further comprises: switch means for closing or opening said line; and switch control means for controlling said switch means to close said line when the voltage output from said backup power source is to be detected by said voltage detection means.

In the above configuration, the switch means is an analog switch.

In an embodiment, the backup power source may comprise a plurality of batteries, and said switch means may be provided for each of said batteries.

In an electronic apparatus having the above-mentioned configuration, when the output voltage of the backup power source is detected by the voltage detection means, the switch means is controlled by the control means so as to close the line which connects the detection means with the backup power source. In this case, the detection means can detect the output voltage of the backup power source.

By contrast, when it is not necessary to detect the output voltage of the backup power source, the switch means is controlled by the control means so as to open the line, whereby the backup power source is electrically disconnected from the voltage detection means.

Therefore, current flows from the backup power source to the voltage detection means only when it is required to detect the output voltage of the backup power source, thus preventing unnecessary consumption of the power of the backup power source.

Thus, the invention described herein makes possible the objectives of:

(1) providing an electronic apparatus in which a useless sneak current is prevented from flowing;

(2) providing an electronic apparatus in which a backup power source can supply power for a longer period of time;

(3) providing an electronic apparatus in which the power of a backup power source is not unnecessarily consumed; and (4) providing an electronic apparatus in which a backup power source is disconnected from a voltage detection means.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
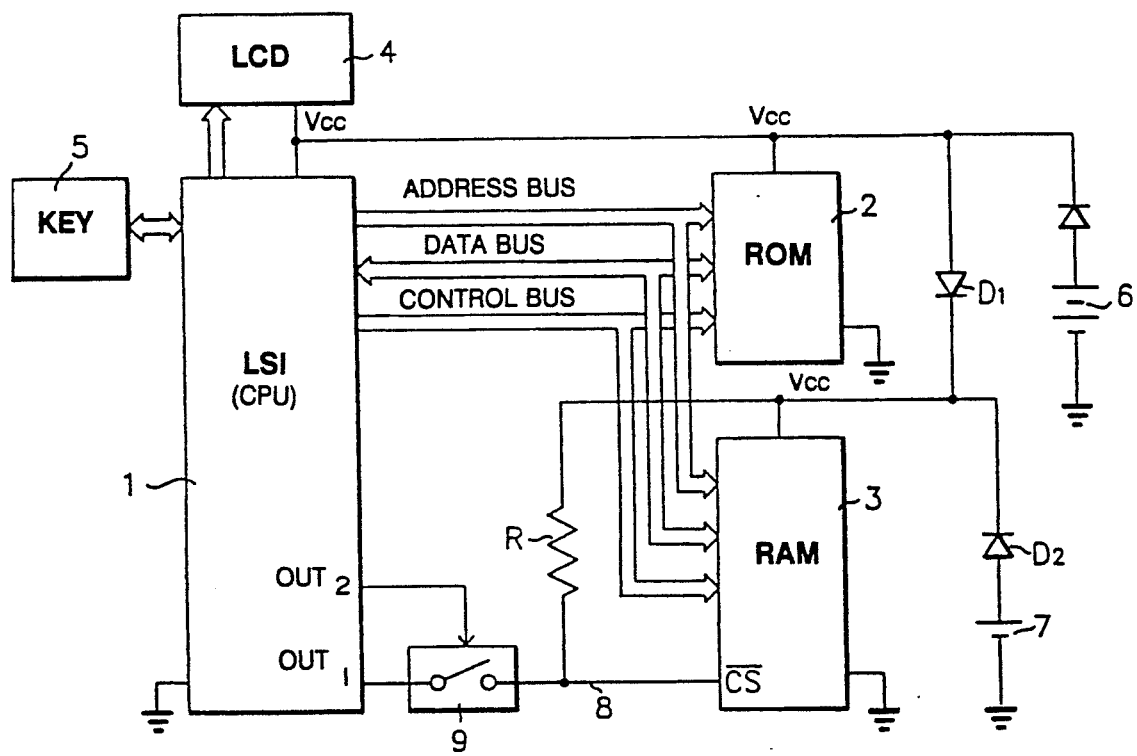
FIG. 1 is a circuit diagram illustrating another electronic apparatus according to the invention.
Figure 3:
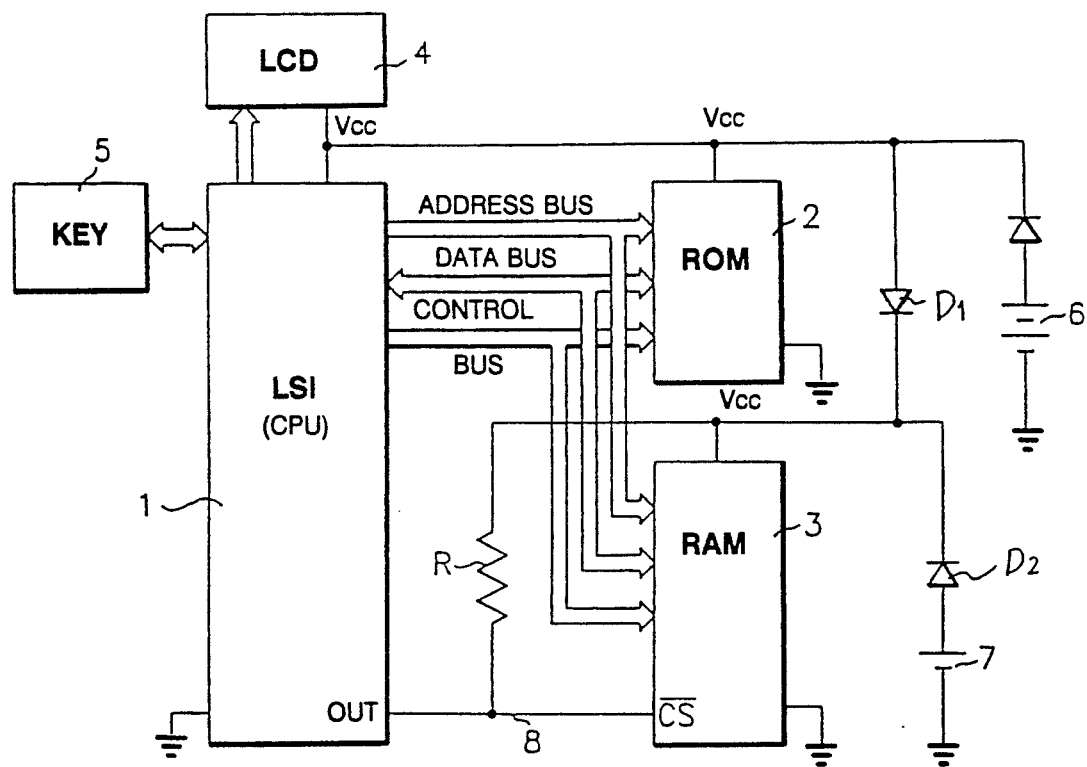
FIG. 3 is a circuit diagram illustrating a prior art electronic apparatus.

FIG. 1 illustrates an electronic apparatus according to the invention. The apparatus of FIG. 1 is a portable terminal apparatus similar to that shown in FIG. 3. The components similar to those shown in FIG. 3 are designated by the same reference numerals, and their description is omitted.

In the apparatus of FIG. 1, the selection control line 8 which connects the chip selection input CS (active low) of the RAM 3 with an output port $OUT_1$ of the LSI 1 is provided with an analog switch 9. The pull-up resistor R is connected to the selection control line 8 at the point between the chip selection input CS and the analog switch 9. When the RAM 3 is to be accessed, the level of the output port $OUT_1$ is set to Low.

The analog switch 9 is an electronic switch which employs an FET as the switching element. The control terminal of the analog switch 9 is connected to an output port $OUT_2$ of the LSI 1. The output port $OUT_2$ is programmed so that it becomes high level only when the RAM 3 is to be accessed, at which time the analog switch 9 is closed. Therefore, in addition to when the low level RAM 3 is in a non-access condition, the analog switch 9 is also opened when the LSI 1 is not powered by the main battery 6.

The operation of the apparatus having the above-described configuration will be described. The CPU in the LSI 1 executes the program stored in the ROM 2. When data is entered from the keyboard 5, the input data is displayed on the liquid crystal display unit 4, and sent to the RAM 3 to be stored therein. At this time, the output port $OUT_2$ of the LSI 1 is High, and therefore the analog switch 9 is closed so that the low level active signal from the output port $OUT_1$ of the LSI 1 is supplied to the chip selection input CS of the RAM 3, thereby enabling the RAM 3 to be accessed.

When the main battery 6 cannot be used anymore because it is being replaced or has become worn out, the power supply to the LSI 1 is stopped, and the backup battery 7 backs up only the RAM 3 to retain data stored therein.

At this time, the output port $OUT_2$ of the LSI 1 is open, and hence the analog switch 9 also becomes open. When this happens, a sneak current from the backup battery 7 can be prevented from flowing to the output port $OUT_1$ of the LSI 1 via the pull-up resistor R. The chip selection input CS of the RAM 3 is maintained at High by the backup battery 7 via the pull-up resistor R so that the RAM 3 goes to a low active condition.

As a result, there is no flow of unnecessary current from the backup battery 7 during backup of the RAM 3, and therefore shortening of backup time is prevented.

Figure 2:
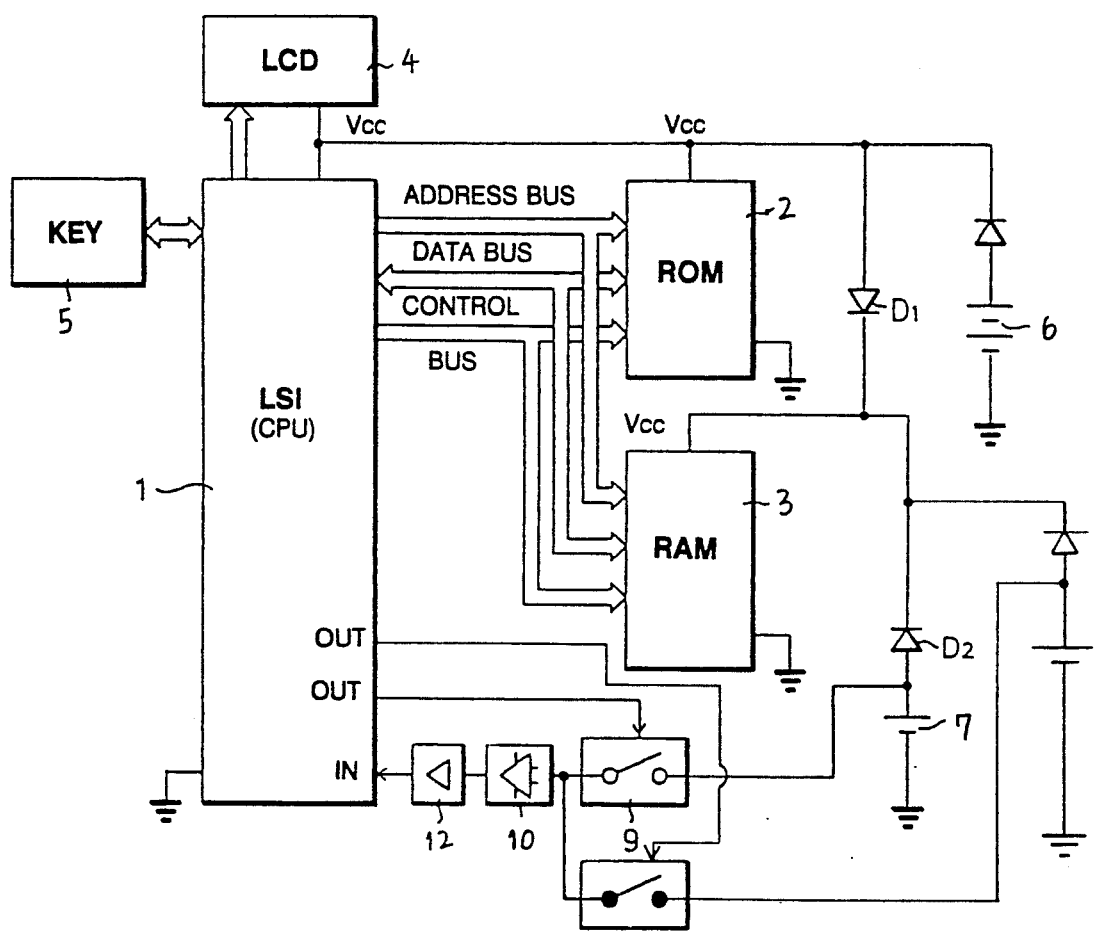
FIG. 2 is a circuit diagram illustrating an electronic apparatus according to the invention.

FIG. 2 illustrates another portable terminal apparatus according to the invention. In this embodiment, the output of the backup battery 7 is connected to the voltage detection circuit 10 via the analog switch 9. The output of the voltage detection circuit 10 is coupled to the input port IN of the LSI 1 through the level shift circuit 12.

Figure 4:
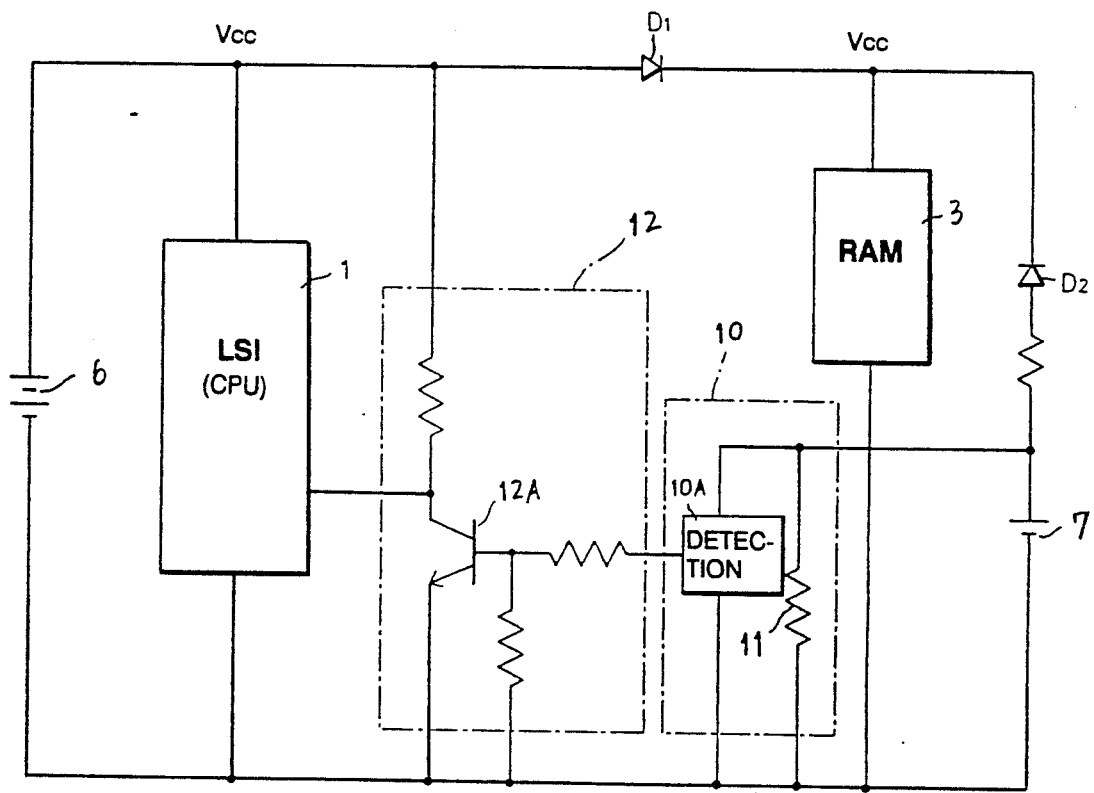
FIG. 4 is a circuit diagram illustrating another prior art electronic apparatus.

The voltage detection circuit 10 and level shift circuit 12 are constructed in the same manner as those shown in FIG. 4. Namely, the voltage detection circuit 10 detects the voltage of the backup battery 7, and inverts its output level depending on whether or not the detected voltage exceeds a predetermined value. The level shift circuit 12 changes the output level of the voltage detection circuit 10 to the level of the input port IN. In this embodiment, the analog switch 9 is connected to the output port OUT of the LSI 1.

The CPU in the LSI 1 executes programs stored in ROM 2 and including that for monitoring the output voltage of the backup battery 7. Before this monitor program is executed, the output port OUT of the LSI 1 is set to High, and the analog switch 9 is closed. In this status, the current from the backup battery 7 flows to the voltage detection circuit 10, thus making it possible for the voltage detection circuit 10 to detect the voltage of the backup battery 7. The output of the voltage detection circuit 10 is supplied to the input port IN of the LSI 1 via the level shift circuit 12.

When the monitor program is then executed, the detection result output from the voltage detection circuit 10 and supplied to the input port IN is used to judge whether or not the voltage of the backup battery 7 has dropped.

When the CPU of the LSI 1 judges that the output voltage of the backup battery 7 has dropped below the allowable limit, the user is warned via the display device 4 to replace the battery with a new one. By this means, the loss of important data in the RAM 2 which is due to lack of backup by the backup battery 7 when the main battery 6 is replaced or has become worn can be prevented.

After the execution of the monitor program is completed, the output port OUT of the LSI 1 is returned to Low level, and the analog switch 9 is opened. When this happens, current stops flowing from the backup battery 7 to the voltage detection circuit 10 until the monitor program is executed next time.

As a result, unnecessary power consumption of the backup battery 7 in periods other than the voltage monitoring period is inhibited, thereby preventing the shortening of the backup time.

In the case of an electronic apparatus having a plurality of backup batteries 7, a configuration may be employed in which one analog switch 9 is provided for each of the backup batteries 7 and each switch 9 is alternately closed to monitor the output voltage of the respective backup battery 7, whereby only one voltage detection circuit 10 is required for detection of the voltage of each of the backup batteries 7.

According to this embodiment, current can be made to flow from the backup battery to the voltage detection circuit only when it is required to monitor the voltage of the backup battery. Therefore, power is not unnecessarily consumed in periods other than the period of monitoring the voltage of the backup battery, thereby preventing shortening of backup time.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In an electronic apparatus comprising: a main power source; at least one semiconductor memory unit having a chip select input; a backup power source for supplying power for retaining the contents of said semiconductor memory unit; selection control means; voltage-pulling means; and a selection control line connected between said selection control means and said chip select input, said selection control line being connected to said backup power source through said voltage-pulling means, said apparatus further comprises:
switch means for closing or opening said selection control line, said switch means being connected between said selection control means and the junction point of said control line and said voltage-pulling means; and
switch control means for controlling said switch means to open said control line when said semiconductor memory unit is powered by said backup power source and when the semiconductor memory unit is in a non-access condition.

2. An apparatus according to claim 1, wherein said voltage-pulling means is a pull-up resistor.

3. An apparatus according to claim 1, wherein said chip select input is active low.

4. An apparatus according to claim 1, wherein said switch means is an analog switch.

5. In an electronic apparatus comprising: a main power source; at least one semiconductor memory unit; a backup power source for supplying power for retaining contents of said semiconductor memory unit; and voltage detection means for detecting the voltage output from said backup power source, said voltage detection means being connected to said backup power source via a line, said apparatus further comprises:
switch means for closing or opening said line; and
switch control means for controlling said switch means to close said line only when the voltage output from said backup power source is to be detected by said voltage detection means.

6. An apparatus according to claim 5, wherein said switch means is an analog switch.

7. An apparatus according to claim 5, wherein said backup power source comprises a plurality of batteries, and said switch means is provided for each of said batteries.

* * * * *